United States Patent [19]

Watanabe

[11] Patent Number: 5,528,206
[45] Date of Patent: Jun. 18, 1996

[54] SURFACE ACOUSTIC WAVE FILTER WITH ATTENUATED SPURIOUS EMISSIONS

[75] Inventor: Toru Watanabe, Nagaokakyo, Japan

[73] Assignee: Murata Manufacturing Co., Ltd., Nagaokakyo, Japan

[21] Appl. No.: 346,260

[22] Filed: Nov. 23, 1994

[51] Int. Cl.$^6$ ............................................... H03H 9/64
[52] U.S. Cl. ........................ 333/194; 333/196; 310/313 R
[58] Field of Search ...................................... 333/193, 194, 333/195, 196; 310/313 R

[56] References Cited

U.S. PATENT DOCUMENTS 4,577,169  3/1986  Meeker et al. ........................... 333/194

FOREIGN PATENT DOCUMENTS

0046317  4/1981  Japan .
1225211  9/1989  Japan .

*Primary Examiner*—Benny Lee
*Assistant Examiner*—David Vu
*Attorney, Agent, or Firm*—Armstrong, Westerman, Hattori, McLeland & Naughton

[57] ABSTRACT

A surface acoustic wave filter includes a piezoelectric substrate. On the surface of the piezoelectric substrate, an input transducer and an output transducer are formed at a predetermined interval. The input transducer and the output transducer are respectively formed with a pair of IDT (interdigital electrode transducers) disposed oppositely. A pair of IDT which construct at least one transducer of the input transducer and the output transducer are formed on the piezoelectric substrate in the following manner. That is, a first impulse train is determined by inverse Fourier transformation of desired transmission characteristics (where, center frequency is $f_0$ and surface wavelength is $_0$), a second impulse train is determined by double over-sampling of the first impulse train along its envelope at a half period, wherein the number of unit impulses of the first impulse train is doubled, a third impulse train is determined by dividing the second impulse train into four impulse trains each, among which second and third impulses are made zero, and the IDT are formed on the piezoelectric substrate corresponding to the third impulse train.

2 Claims, 8 Drawing Sheets

SURFACE ACOUSTIC WAVE FILTER WITH ATTENUATED SPURIOUS EMISSIONS

FIELD OF THE INVENTION

The present invention relates to a surface acoustic wave filter.

DESCRIPTION OF THE RELATED ART

In a second IF (intermediate frequency) filter for DBS (direct broadcasting satellite), for a desired level of its broadcasting system, a good DG (differential gain)/DP (differential phase) characteristic is required. Since the DG/DP characteristic is affected by an undulation and ripple of the in-pass band amplitude characteristic and GDT (group delay time) characteristic, the undulation and ripple of the in-passband amplitude characteristic and GDT characteristic should be reduced as much as possible. In this case, it is also affected largely by a so-called TTE (triple transit echo) peculiar to the surface acoustic wave filter, thus the impedance of an IDT (interdigital electrode transducer) must be adjusted delicately so that a loss, which is in an opposite relationship with the TTE, does not become too small. In the case of such use, though a 50 system is generally used, the impedance of the IDT often becomes too close to 50 Ω thus the impedance must be brought higher.

Figure 9:
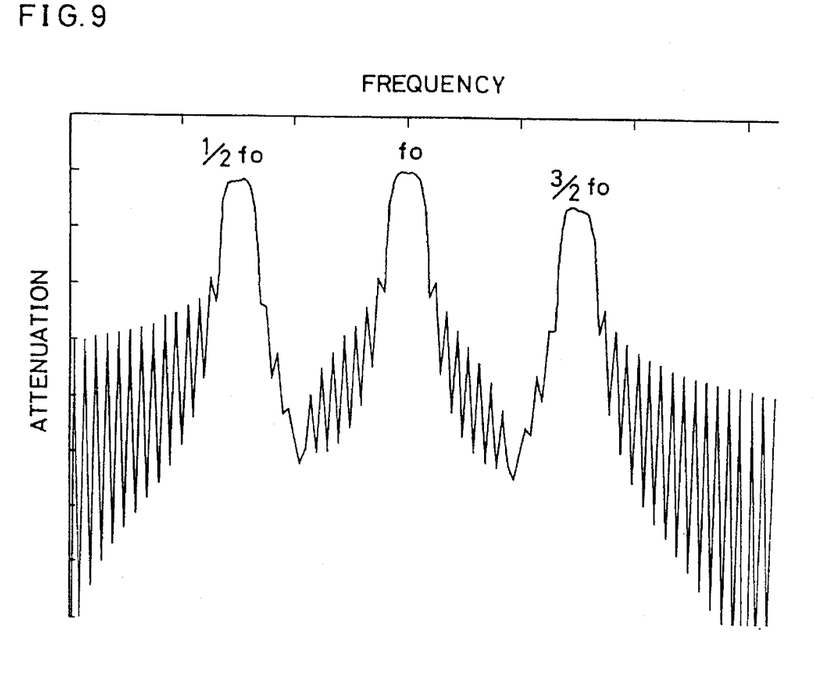
FIG. 9 is a frequency response diagram of the impulse train in the conventional example.
Figure 10:
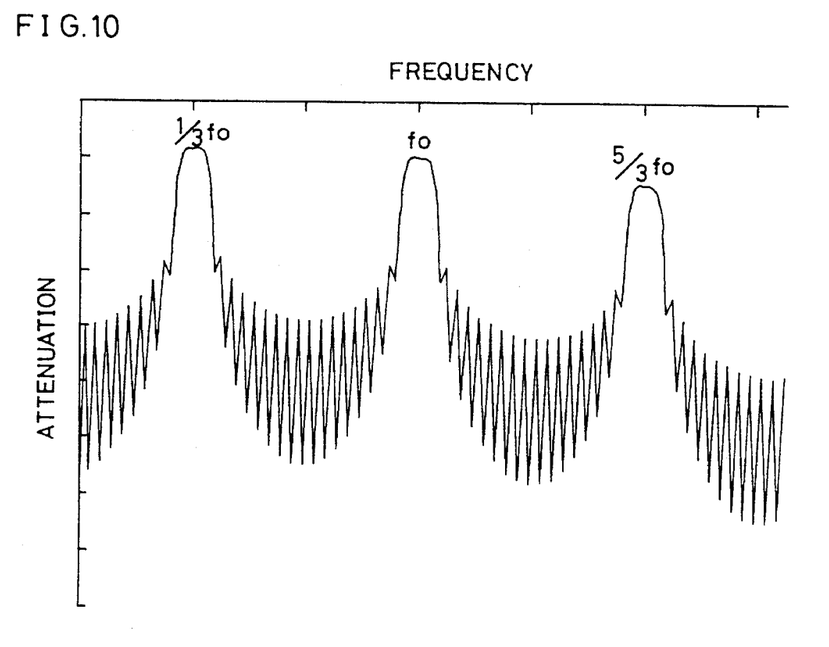
FIG. 10 is a frequency response diagram of the impulse train in the conventional example.

Conventionally, as a means for bringing the impedance higher, there are a method of narrowing the cross width of interdigital electrodes and a method of thinning an impulse train periodically or a so-called sampling method. In the method of narrowing the cross width of the interdigital electrodes, it is largely affected by a diffraction, causing the undulation in the passband and the lifting of a side lobe. In the sampling method, depending upon the sampling period, various spurious emissions occur in the vicinity of the necessary frequency band, deteriorating the side lobe. For example, as described in Japanese Patent application laid open public inspection No. 225211/1989, in the sampling method of bringing the cross width of every two out of four impulse trains of the interdigital electrodes to zero (hereinafter, referred to as a half sampling), as shown in FIG. 9, a spurious response is produced on the low-pass side and high-pass side at half and 3/2 times the center frequency $f_0$. In the sampling method of bringing the cross width of every two out of three impulse trains of the interdigital electrodes to zero (hereinafter, referred to as a ⅓ sampling), as shown in FIG. 10, the spurious response is produced on the low-pass side and high-pass side at ⅓ and 5/3 times the center frequency $f_0$.

SUMMARY OF THE INVENTION

It is an object of the present invention to provide a surface acoustic wave filter, whereby a desired impedance value of interdigital electrodes is obtained and a triple transit echo is reduced to have little in-band ripple without deteriorating an out-band attenuation amount.

In order to achieve the above-mentioned object, the present invention is directed to a surface acoustic wave filter, whereby a first impulse train is formed by inverse Fourier transformation of desired transmission characteristics (where, center frequency is $f_0$ and surface wavelength is $\lambda_0$), a second impulse train is formed by double over-sampling of the first impulse train along its envelope at a half period, wherein the number of unit impulses are formed by dividing the second impulse train into four impulse trains each, among which second and third impulses are made zero, and the interdigital electrode transducers are formed on the piezoelectric substrate corresponding to the third impulse train.

The present invention is also directed to the surface acoustic wave filter, whereby the IDT is formed by electrode trains wherein an electrode width and the electrode interval of the IDT are generally $\lambda_0/8$.

The present invention operates to double the center frequency $f_0$ (a main response) to $2 f_0$ by the double over-sampling of the impulse train obtained by the inverse Fourier transformation, and further, by using the response of the center frequency $f_0$ obtained by the ½ sampling, the spurious emission is not produced in the low-pass side and the spurious emission of the side lobe on the high-pass side can be separated from the center frequency $f_0$ (main response). Besides, when the IDT impedance is in resistance capacity parallel indication, the resistance value can be doubled and an insertion loss can be adjusted to reduce the in-band ripple.

Thus, according to the present invention, by raising the center frequency $f_0$ (main response) to $2 f_0$ by the double over-sampling of the impulse train obtained by an inverse Fourier transformation, and further, by using the spurious ($f_0$) which is half the $2 f_0$ obtained by the ½ sampling, a high impedance of approximately twice the original impedance can be realized without producing the spurious emission on the low-pass side and deteriorating the out-band attenuation by separating the spurious emission of the side lobe on the high-pass side apart from the main response. And hence, as compared with the conventional sampling method, the unnecessary spurious emission is not produced in a necessary frequency band as described above.

Also, by deciding the electrode width and the electrode interval of the IDT at $\lambda_0/8$, a reduction effect of the ripple by the TTE can be maintained as in the past.

The above and other objects, features, aspects and advantages of the present invention will become more apparent from the following detailed description of the embodiments made with reference to the drawings.

BRIEF DESCRIPTION OF THE DRAWINGS

FIGS. 6A–6B show a specific application of the present invention, where

DESCRIPTION OF THE PREFERRED EMBODIMENTS

Figure 1:
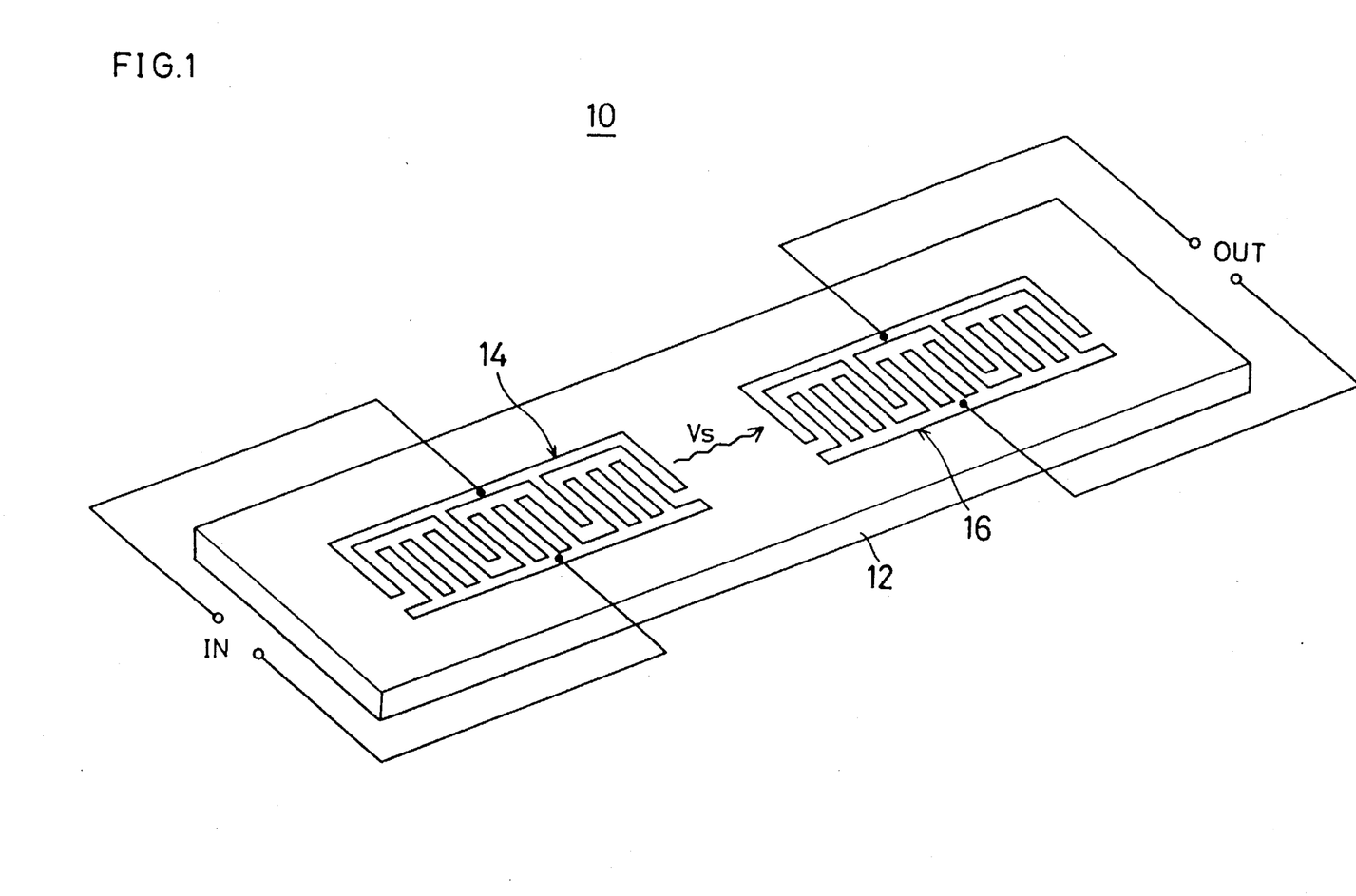
FIG. 1 is a perspective view showing a schematic configuration of one embodiment of the present invention.

FIG. 1 is a perspective view showing a schematic configuration of one embodiment of the present invention.

A surface acoustic wave filter 10 includes a piezoelectric substrate 12. The piezoelectric substrate 12 is formed by a piezoelectric material such as $LiBnO_3$ and PZT or deposited thin films such as ZnO or an insulating substrate. On the surface of the piezoelectric substrate 12, an input transducer 14 and an output transducer 16 are formed at a predetermined interval.

Figure 5A:
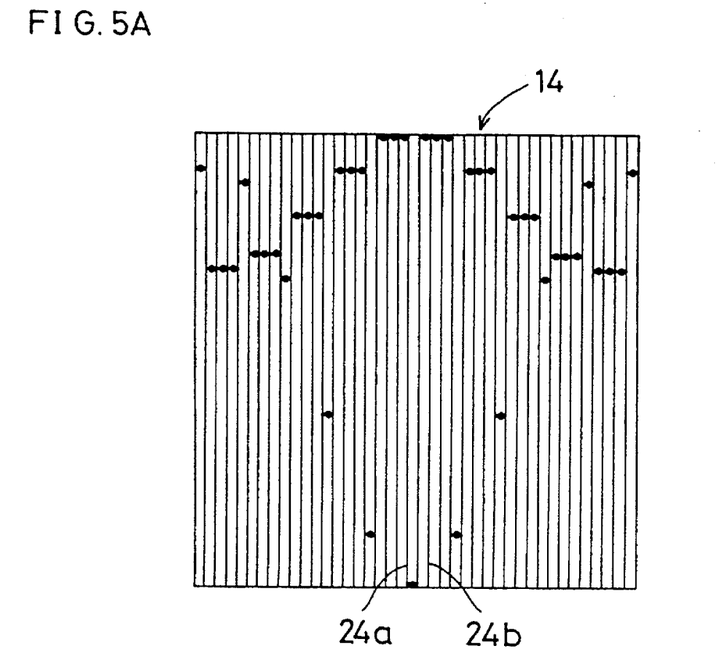
FIG. 5A is a schematic plan view showing a weighted IDT, which made a solid type IDT of the third impulse train of the third impulse train shown in FIG. 4A.

As shown in FIG. 5A, the input transducer 14 is formed with a pair of interdigital electrodes 24a and 24b disposed in an opposite relationship. The IDT (interdigital electrodes) 24a and 24b are formed to cross one another. In this case, the cross-width of the interdigital electrodes 24a and 24b is not constant throughout the input transducer 14, and as is shown by dots in FIG. 5A, it is set to become wider at the center. That is, the input transducer 14 takes the form of cross-width weighted electrodes. On the other hand, the output transducer 16 is formed with a pair of interdigital electrodes 24a and 24b and takes the form of interdigital electrodes having a definite cross width.

Meanwhile, the output transducer 16 may be formed by a pair of cross width weighted interdigital electrodes 24a and 24b and the input transducer 14 by a pair of interdigital electrodes whose cross-width is constant. Both the output transducer 16 and the input transducer 14 may also be constructed by a pair of cross-width weighted electrodes.

An electric signal applied to the interdigital electrodes 24a and 24b on the input side is transformed into an elastic surface wave by the input transducer 14 constituted by the portions of the interdigital electrodes 24a and 24b. As indicated at Vs in FIG. 1, the elastic surface wave propagates along the surface of the piezoelectric substrate 10 and reaches the interdigital electrodes 24a and 24b on the output side. The elastic surface wave Vs reaching the interdigital electrodes 24a and 24b is transformed into the electric signal by the output transducer 16 constituted by the portions of the interdigital electrodes 24a and 24b and outputted to the outside.

Next, the structure of the interdigital electrodes characterizing the embodiment according to the present invention will be specifically described with reference to FIG. 2A to FIG. 2C, FIG. 3A to FIG. 3E, FIG. 4A to FIG. 4C and FIG. 5A to FIG. 5C.

Figure 2A:
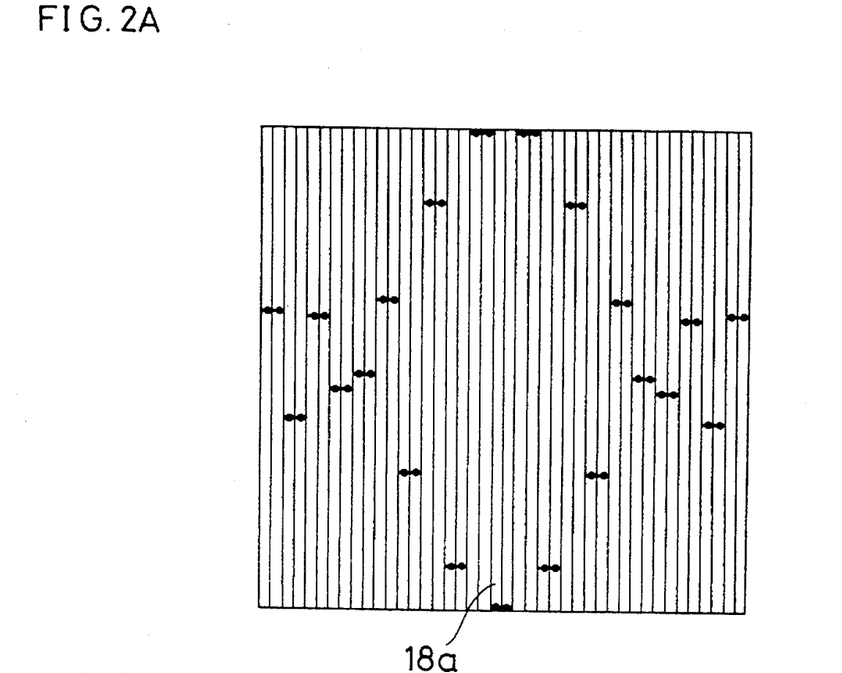
FIG. 2A is a schematic plan view showing a split type IDT (interdigital electrodes) with a configuration determined by a first impulse train obtained by the inverse Fourier transformation of transmission characteristics.

FIG. 2A shows a split type IDT (interdigital electrodes) 18a having a configuration determined from a cross-width weighted impulse train by inverse Fourier transformation of desired transmission characteristics of the center frequency $f_0$. That is, since the frequency response characteristic is the Fourier transformation of an impulse response, by the inverse Fourier transformation of the frequency response characteristic, the impulse response is obtained. When the interdigital electrodes are formed corresponding to the impulse response, a desired frequency response characteristic is obtained. In this case, by changing the cross width of the interdigital electrodes or by weighting, the split type IDT 18a corresponding to the impulse response is formed.

Figure 2B:
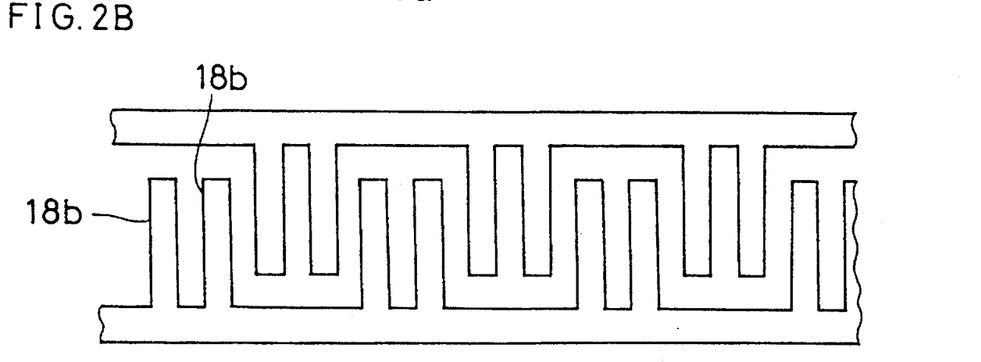
FIG. 2B is an enlarged plan view of essential portions of a normal type IDT of a constant cross width for illustrating FIG. 2A clearly.
Figure 2C:
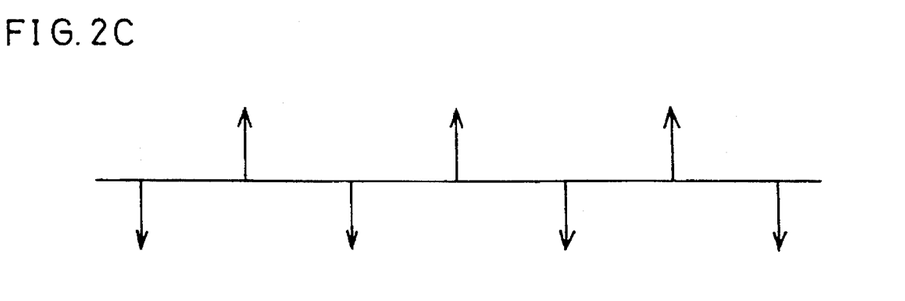
FIG. 2C is a conceptual diagram of vectors of the impulse train shown in FIG. 2B.

As to the split type IDT 18a, its electrode interval is shown not by a width but by a line. FIG. 2B schematically shows the alignment of the impulse trains of the split type IDT 18a shown in FIG. 2A, by a split type IDT 18b corresponding to the normal type impulse train of a constant cross width, taking into account of the electrode intervals. FIG. 2C is a conceptual diagram of vectors of the impulse trains shown in FIG. 2B.

Figure 3A:
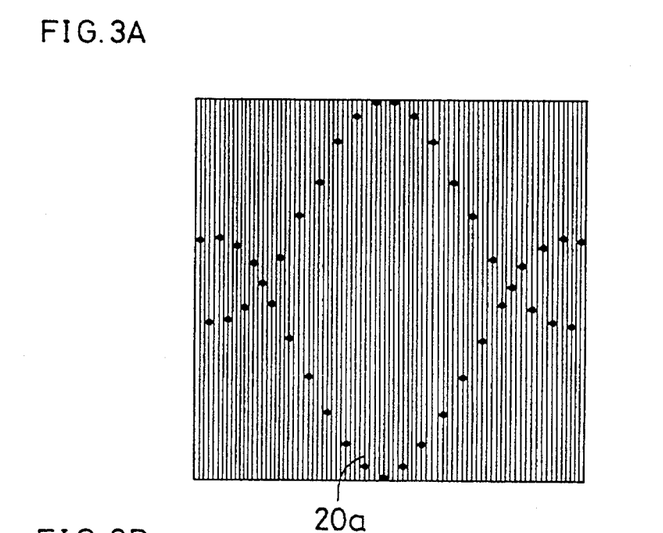
FIG. 3A is a schematic plan view showing a split type IDT provided by a second impulse train with a configuration determined by the double over-sampling of the first impulse train shown in FIG. 2A along its envelope at a half period.

FIG. 3A shows a split type IDT 20a having a configuration determined from a second impulse train by the double over-sampling (this means two samplings performed in one period) of the weighted first impulse train shown in FIG. 2A along its envelope at a half period of the first impulse train.

The above-mentioned double over-sampling is described additionally. FIG. 3D shows the first impulse train obtained by inverse Fourier transformation, wherein 20c and 20d respectively designate upper and lower envelopes of the first impulse train. The sampling is performed alternately at positions on the impulses and therebetween (20e, 20f, ...), along the upper and lower envelopes 20c and 20d. Then, as shown in FIG. 3E, the number of rising impulses is doubled. Thus, it is called double oversampling.

Figure 3B:
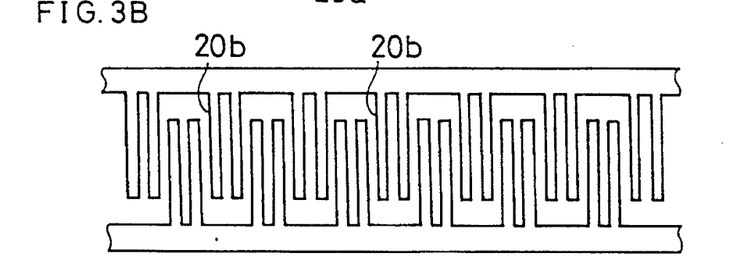
FIG. 3B is an enlarged plan view of essential portions of the normal type IDT of a constant cross width for illustrating FIG. 3A clearly.
Figure 3C:
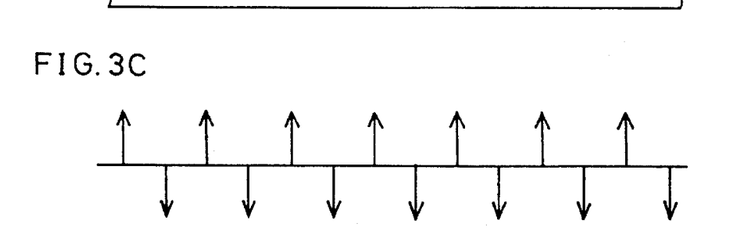
FIG. 3C is a conceptual diagram of vectors of the second impulse train shown in FIG. 3B.
Figure 3D:
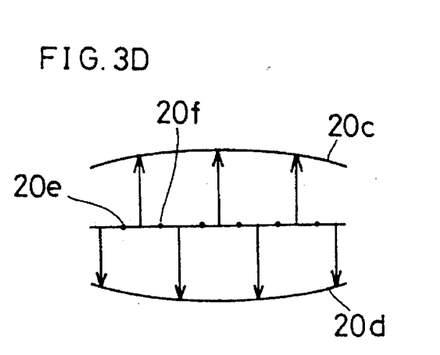
FIG. 3D and FIG. 3E are explanatory views in the case of double over-sampling along the envelope at a half period.
Figure 3E:
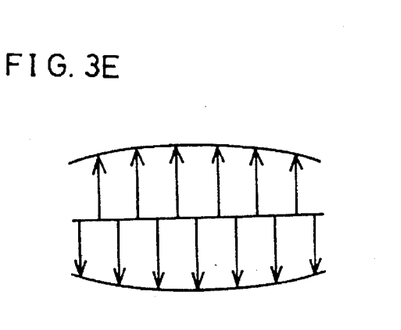
Figure 7:
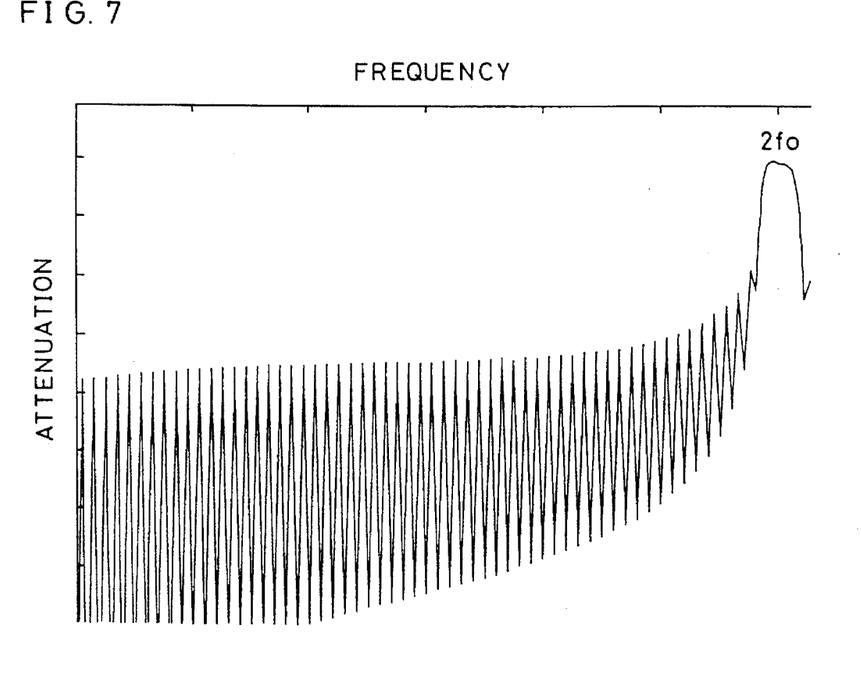
FIG. 7 is a frequency response diagram of the impulse train shown in FIG. 3A.

FIG. 3B schematically shows an alignment of the impulse trains of the split type IDT 20a corresponding to the weighted second impulse train shown in FIG. 3A, by the normal split type IDT 20b corresponding to the impulse train a constant cross width, taking into account of the electrode intervals. FIG. 3C is a conceptual diagram of vectors of the impulse train shown in FIG. 3B. As shown in FIG. 7, the frequency response of the split type IDT 20a shown in FIG. 3 only produces a response of 2 $f_0$.

Figure 4A:
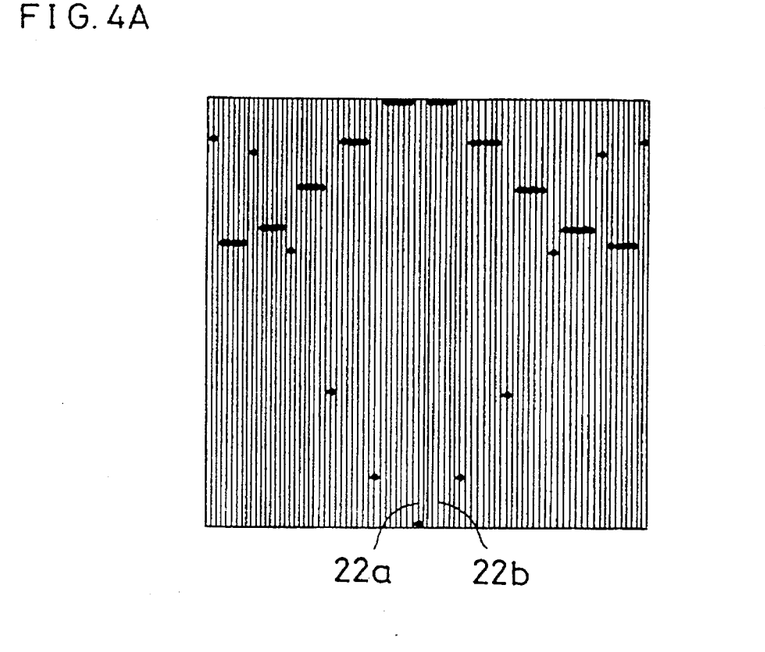
FIG. 4A is a schematic plan view showing a split type IDT provided by a third impulse train with a configuration determined by bringing the second impulse train shown in FIG. 3A periodically to zero.
Figure 4B:
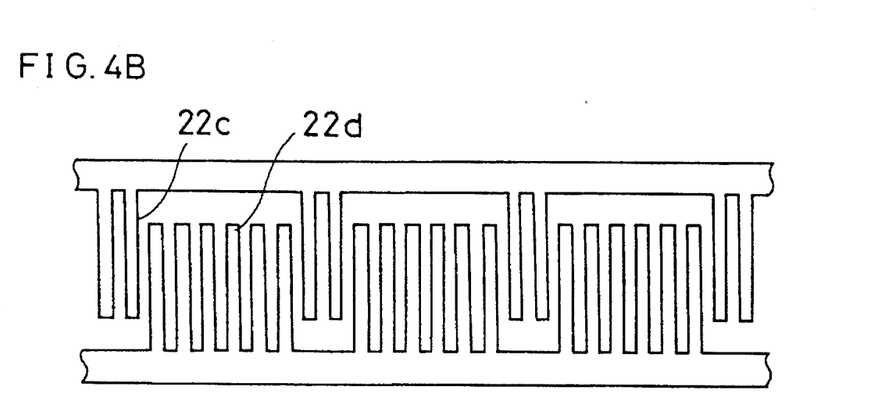
FIG. 4B is enlarged plan view of essential portion of the normal type IDT of a constant cross width for illustrating FIG. 4A clearly.

FIG. 4A shows split type IDT 22a and 22b having a configuration determined from a third impulse train, which is obtained by dividing the weighted second impulse train shown in FIG. 3A into each four impulse trains, among which second and third impulses are made zero. FIG. 4B schematically shows the alignment of the impulse trains of the split type IDT 22a and 22b corresponding to the weighted impulse train shown in FIG. 4A, by the normal split type IDT 22c and 22d corresponding to the impulse train of a constant cross width, taking into account of the electrode intervals.

Figure 4C:
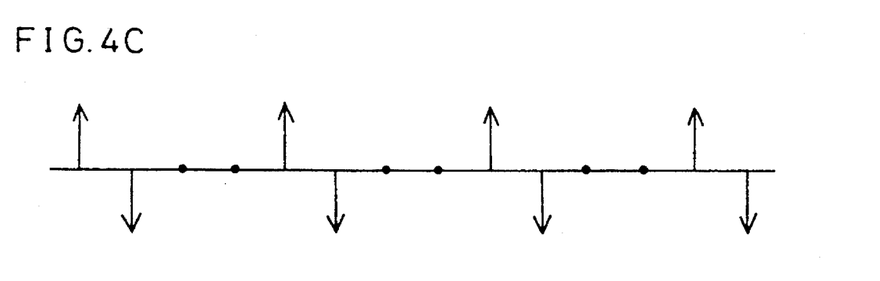
FIG. 4C is a concept diagram of vector of the impulse train of FIG. 4B.
Figure 8:
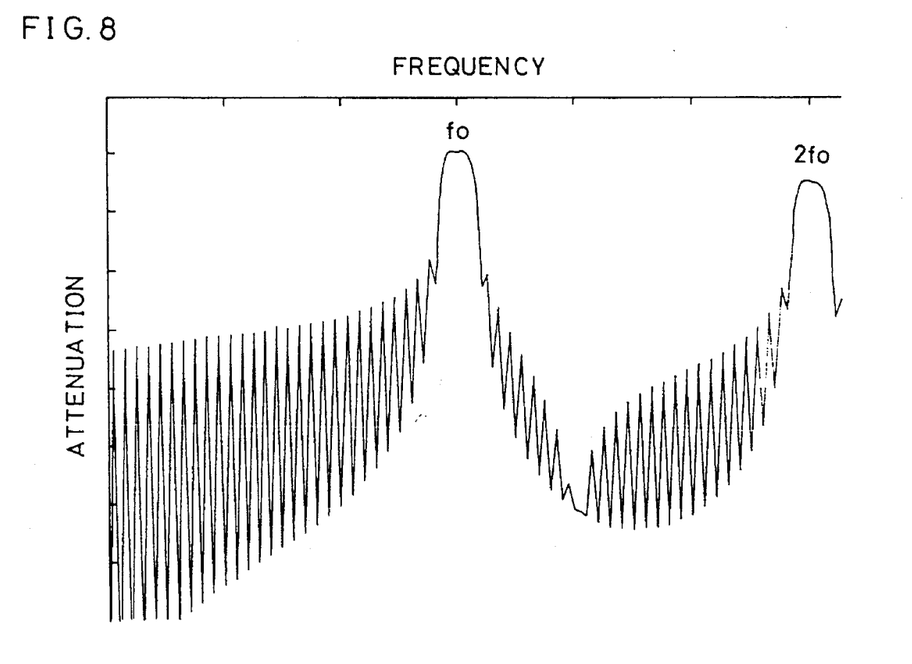
FIG. 8 is a frequency response diagram of the impulse train shown in FIG. 4A and FIG. 5A.

In FIG. 4A and FIG. 4B, while the split type IDT 22a and 22c have two split electrode fingers each, the heteropolar split type IDT 22b and 22d have six split electrode fingers each. This situation can be understood more clearly in FIG. 4B. FIG. 4C is a conceptual diagram of vectors of the impulse train shown in FIG. 4B. It is understood that, as shown in FIG. 8, the frequency response of the embodiment shown in FIG. 4A is much improved as compared with the conventional corresponding examples shown in FIG. 9 and FIG. 10, because that when the center frequency (main response) is $f_0$, the spurious emission is not produced between 0 to 2 $f_0$. Such frequency characteristic is most suitable for an IF circuit.

Figure 5B:
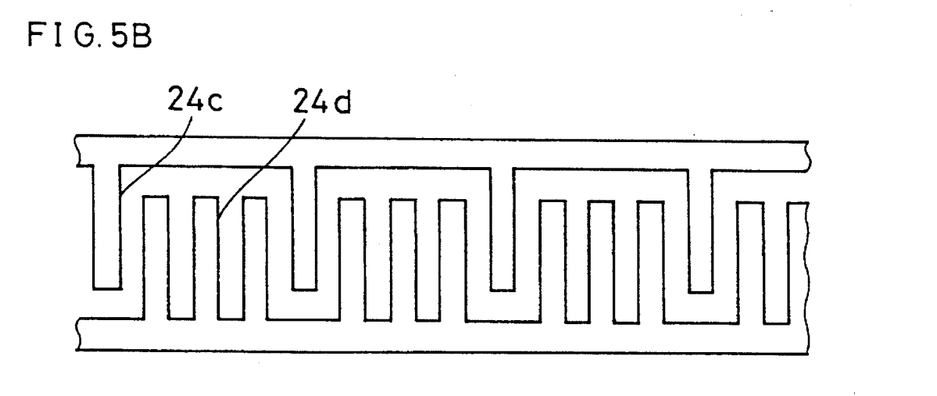
FIG. 5B is an enlarged plan view of essential portions of the normal type IDT of a constant cross width for illustrating FIG. 5A clearly.

FIG. 5A shows the weighted third impulse train shown in FIG. 4A which is constituted by solid type IDT 24a and 24b. FIG. 5B schematically shows the alignment of impulse trains of the solid type IDT 24a and 24b corresponding to the weighted impulse train shown in FIG. 5A, by normal solid type IDT 24c and 24d corresponding to the impulse train of a constant cross width, taking into account the electrode intervals.

Figure 5C:
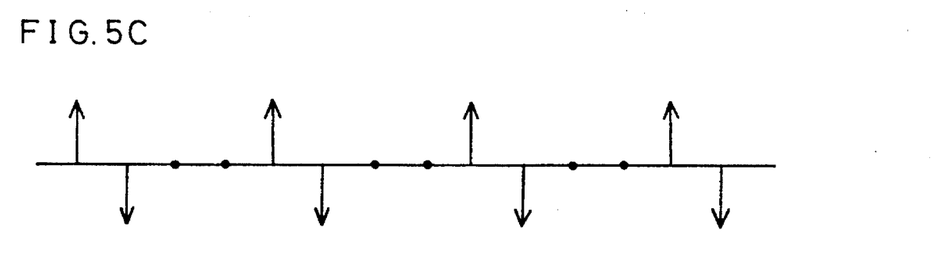
FIG. 5C is a concept diagram of vector of the impulse train of FIG. 5B.

In FIG. 5A and FIG. 5B, while the solid type IDT 24a and 24c have one solid electrode finger each, the heteropolar solid type IDT 24b and 24d have three solid electrode fingers each. This situation can be clearly understood in FIG. 5B. FIG. 5C is a conceptual diagram of vector of the impulse train show in FIG. 5B. It is understood that, as is shown in FIG. 8, the frequency response of the embodiment shown in FIG. 5 is also improved as compared with the conventional corresponding example shown in FIG. 9 and FIG. 10, because the center frequency (main response) is $f_0$, the spurious emission is not produced on the low-pass side and the spurious emission of the side lobe on the high-pass side can be separated from the main response by $f_0$.

In the embodiment shown in FIG. 5A, since the center frequency (main response) is $f_0$ and the electrode width and electrode interval are $\lambda_0/8$, it is effective in reducing the TTE. Particularly, in the case of FIG. 5A, as compared with FIG. 4A, the electrode width is doubled and a poor workability can be largely reduced.

When comparing the embodiment shown in FIG. 5A according to the present invention with the IDT shown in FIG. 2A, in this embodiment, the impedance of the IDT can be doubled. In FIG. 2A and FIG. 5A, though the number of electrode fingers are not equal between the homopolar and heteropolar IDT, since envelopes of the impulse train are equal, frequency response characteristics in the vicinity of the center frequency $f_0$ become similar.

In the above-mentioned embodiment, though the IDT by the weighted impulse train has been described, the present invention is also applicable in the IDT by the normal type impulse train.

Figure 6A:
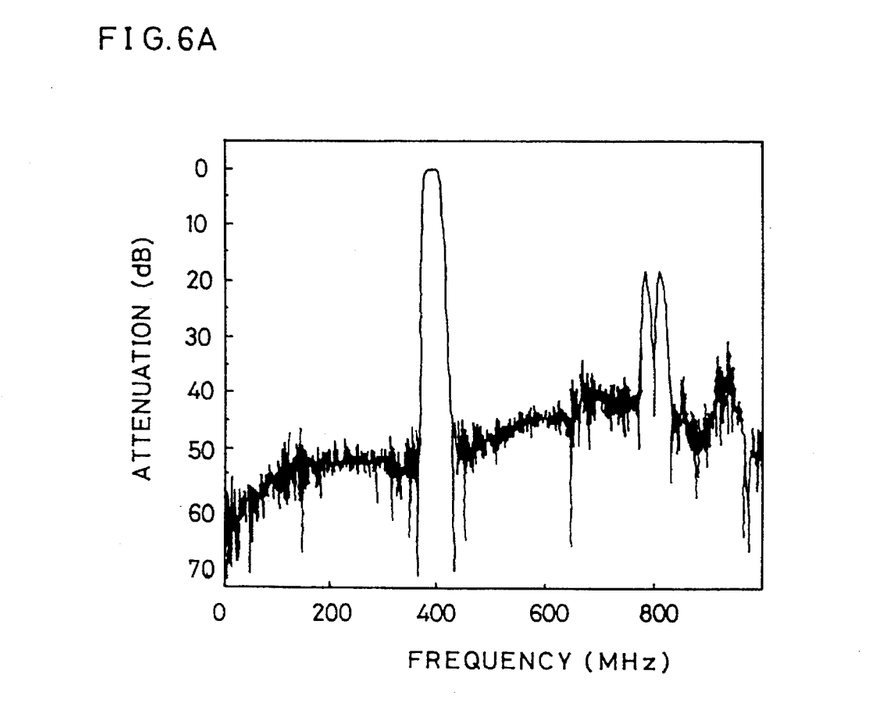
FIG. 6A is a spurious characteristic diagram in a wide frequency range.
Figure 6B:
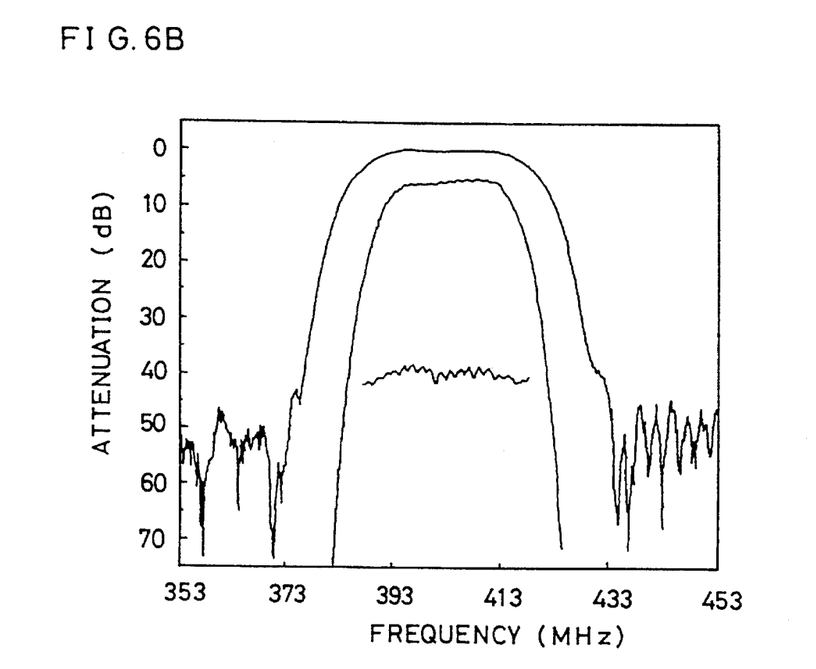
FIG. 6B is a characteristic diagram of a pass frequency band.

Next, the case where the present invention is specifically applied in the second IF filter for DBS (center frequency $f_0$ is 402.78 MHz) is shown in FIG. 6. A piezoelectric substrate material is 128° Y-X LiNbO$_3$. The weighted IDT is 54 pairs at the center frequency $f_0$ and corresponds to the embodiment shown in FIG. 5A, and the normal type IDT is 12.5 pairs and being subjected to the ⅓ sampling. As it will be apparent from an attenuation characteristic diagram shown in FIG. 6A, the spurious is not produced between 0 to 2 $f_0$ (about 800 MHz), and as is shown in FIG. 6B, the main frequency response characteristic is also good with small ripples.

It will be apparent from the foregoing that, while the present invention has been described in detail and illustrated, these are only particular illustrations and example and the invention is not limited to these. The spirit and scope of the invention is limited only by the appended claims.

What is claimed is:

1. A surface acoustic wave filter, comprising:

a piezoelectric substrate; and interdigital electrodes formed on the surface of said piezoelectric substrate, wherein (a) a first impulse train is formed by inverse Fourier transformation of desired transmission characteristics where the center frequency is $f_0$ and an elastic surface wavelength is $\lambda_0$, (b) a second impulse train is formed by double oversampling of said first impulse train along an envelope of said first impulse train at a half period, wherein the number of unit impulses of said first impulse train is doubled, (c) a third impulse train is formed by dividing said second impulse train into four impulse trains each, among which second and third impulses are made zero, and said interdigital electrodes are formed on said piezoelectric substrate corresponding to said third impulse train.

2. A surface acoustic wave filter in accordance with claim 1, wherein an electrode width and an electrode interval of said interdigital electrodes are generally $\lambda_0/8$.

\* \* \* \* \*